United States Patent
Budde

(10) Patent No.: US 9,793,753 B2
(45) Date of Patent: Oct. 17, 2017

(54) POWER QUALITY DETECTOR

(71) Applicant: SCHNEIDER ELECTRIC IT CORPORATION, West Kingston, RI (US)

(72) Inventor: Kristian Budde, Kolding (DK)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 202 days.

(21) Appl. No.: 14/429,970

(22) PCT Filed: Sep. 21, 2012

(86) PCT No.: PCT/US2012/056607
§ 371 (c)(1),
(2) Date: Mar. 20, 2015

(87) PCT Pub. No.: WO2014/046673
PCT Pub. Date: Mar. 27, 2014

(65) Prior Publication Data
US 2015/0236549 A1  Aug. 20, 2015

(51) Int. Cl.
*G01R 21/00* (2006.01)
*H02J 9/06* (2006.01)

(52) U.S. Cl.
CPC .............. *H02J 9/061* (2013.01); *G01R 21/00* (2013.01); *Y10T 307/344* (2015.04); *Y10T 307/832* (2015.04)

(58) Field of Classification Search
CPC ...... H02J 9/061; G01R 21/00; Y10T 307/344; Y10T 307/832
(Continued)

(56) References Cited

U.S. PATENT DOCUMENTS 5,943,246 A * 8/1999 Porter .................... H02H 3/207
307/43
6,295,215 B1 * 9/2001 Faria ....................... H02J 9/062
363/124
(Continued)

FOREIGN PATENT DOCUMENTS

EP  2038782 B1  12/2011

OTHER PUBLICATIONS

Notification of Transmittal of the International Search Report and the Written Opinion of the International Searching Authority from corresponding PCT/US2012/056607 dated Feb. 26, 2013.

*Primary Examiner* — Brandon S Cole
(74) *Attorney, Agent, or Firm* — Lando & Anastasi, LLP

(57) ABSTRACT

Systems and methods of controlling an uninterruptible power supply are provided. The uninterruptible power supply includes an input configured to receive input power, one or more sensors configured to monitor one or more parameters related to the input power, an output, a power conversion circuit coupled with the input and the output, a bypass switch configured to couple the input to the output in a bypass mode of operation, and a controller coupled with the power conversion circuit, and the bypass switch. The controller is configured to receive, from the one or more sensors, values for the one or more parameters, filter the values to determine one or more quality metrics, calculate, based on the quality metrics, a quality measure of the input power, and control the bypass switch based on the quality measure.

18 Claims, 4 Drawing Sheets

(58) Field of Classification Search
USPC .................................................... 307/1–87
See application file for complete search history.

(56) References Cited

U.S. PATENT DOCUMENTS

| | | | |
|---|---|---|---|
| 7,061,139 B2 | 6/2006 | Young et al. | |
| 7,372,177 B2 | 5/2008 | Colombi et al. | |
| 7,855,472 B2 | 12/2010 | Hjort et al. | |
| 7,948,778 B2* | 5/2011 | Pfitzer | G01R 31/40 363/34 |
| 8,214,165 B2* | 7/2012 | Dishman | G01R 31/40 702/193 |
| 8,803,361 B2* | 8/2014 | Johansen | H02J 9/062 307/64 |
| 2002/0011752 A1 | 1/2002 | Powell et al. | |
| 2003/0048006 A1* | 3/2003 | Shelter, Jr. | H02J 9/061 307/64 |
| 2003/0227785 A1* | 12/2003 | Johnson, Jr. | H02J 9/062 363/37 |
| 2005/0033481 A1 | 2/2005 | Budhraja et al. | |
| 2005/0162019 A1* | 7/2005 | Masciarelli | H02J 9/062 307/66 |
| 2005/0168073 A1 | 8/2005 | Hjort | |
| 2006/0043792 A1* | 3/2006 | Hjort | H02J 9/062 307/1 |
| 2006/0043797 A1* | 3/2006 | Hjort | H02J 7/0047 307/46 |
| 2006/0227579 A1* | 10/2006 | Glauser | H02J 9/062 363/71 |
| 2010/0110731 A1* | 5/2010 | Murai | H02J 9/062 363/15 |
| 2011/0187197 A1* | 8/2011 | Moth | H02J 9/062 307/66 |

* cited by examiner

POWER QUALITY DETECTOR

This application is a U.S. National Stage Application under 35 U.S.C. §371 of International Application No. PCT/US2012/056607, filed Sep. 21, 2012, which is hereby incorporated herein by reference in its entirety.

BACKGROUND

Field of Invention

At least one embodiment of the present invention relates generally to control of an uninterruptible power supply.

Discussion of Related Art

Uninterruptible power supplies (UPS) are used to provide reliable power to many different types of electronic equipment. Uninterruptible power supplies regulate power provided to a load, and can provide backup power to a load in the event of a loss of primary power, such as during black out or brown out conditions. Unwanted fluctuations in power provided to a load can waste energy and damage electrical equipment, which results in increased cost, a loss of productivity and can require repair or replacement of electrical components.

SUMMARY

At least one aspect of the invention is directed to an uninterruptible power supply. The uninterruptible power supply includes an input configured to receive input power, one or more sensors configured to monitor one or more parameters related to the input power, an output, a power conversion circuit coupled with the input and the output, a bypass switch configured to couple the input to the output in a bypass mode of operation, and a controller coupled with the power conversion circuit, and the bypass switch. The controller is configured to receive, from the one or more sensors, values for the one or more parameters, filter the values to determine one or more quality metrics, calculate, based on the quality metrics, a quality measure of the input power, and control the bypass switch based on the quality measure.

The quality measure can include a likelihood of a grid failure. The controller can be configured to activate the bypass mode of operation based on comparison of the quality measure with a first threshold. The uninterruptible power supply can further include a backup power source coupled to the power conversion circuit, and the controller can be configured to couple the output to the backup power source based on comparison of the quality measure with a second threshold.

The controller can be further configured to normalize the one or more quality metrics to generate quality ratings, generate, based on the quality ratings, confidence measures, and calculating the quality measure can include combining the confidence measures to generate the quality measure. Generating the confidence measures can include comparing one or more quality metrics to one or more threshold measures. The one or more threshold measures can be determined based on one or more quality metrics measured preceding one or more past grid failures. The quality metrics can be normalized and the confidence measures can be generated based on a set of algorithms, the set of algorithms adjusted based on the one or more quality metrics measured preceding the one or more past grid failures.

The sensors can include at least one of a grid voltage ripple sensor, a grid voltage error sensor, and a grid frequency error sensor. The controller can be configured to filter the parameters using at least one of a fast transient detection filter, a ripple integration filter, a root mean square error integration filter, a root mean square voltage level offset detection filter, a harmonics detection filter, a frequency offset detection filter, and a frequency stability detection filter.

Another aspect is directed to a method of distributing power using an uninterruptible power supply. The method includes receiving, at an input, an input power, monitoring one or more parameters related to the input power, filtering values for the one or more parameters to determine one or more quality metrics, calculating, based on the quality metrics, a quality measure of the input power, and providing, at an output, an output power, a source of the output power based on the quality measure.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
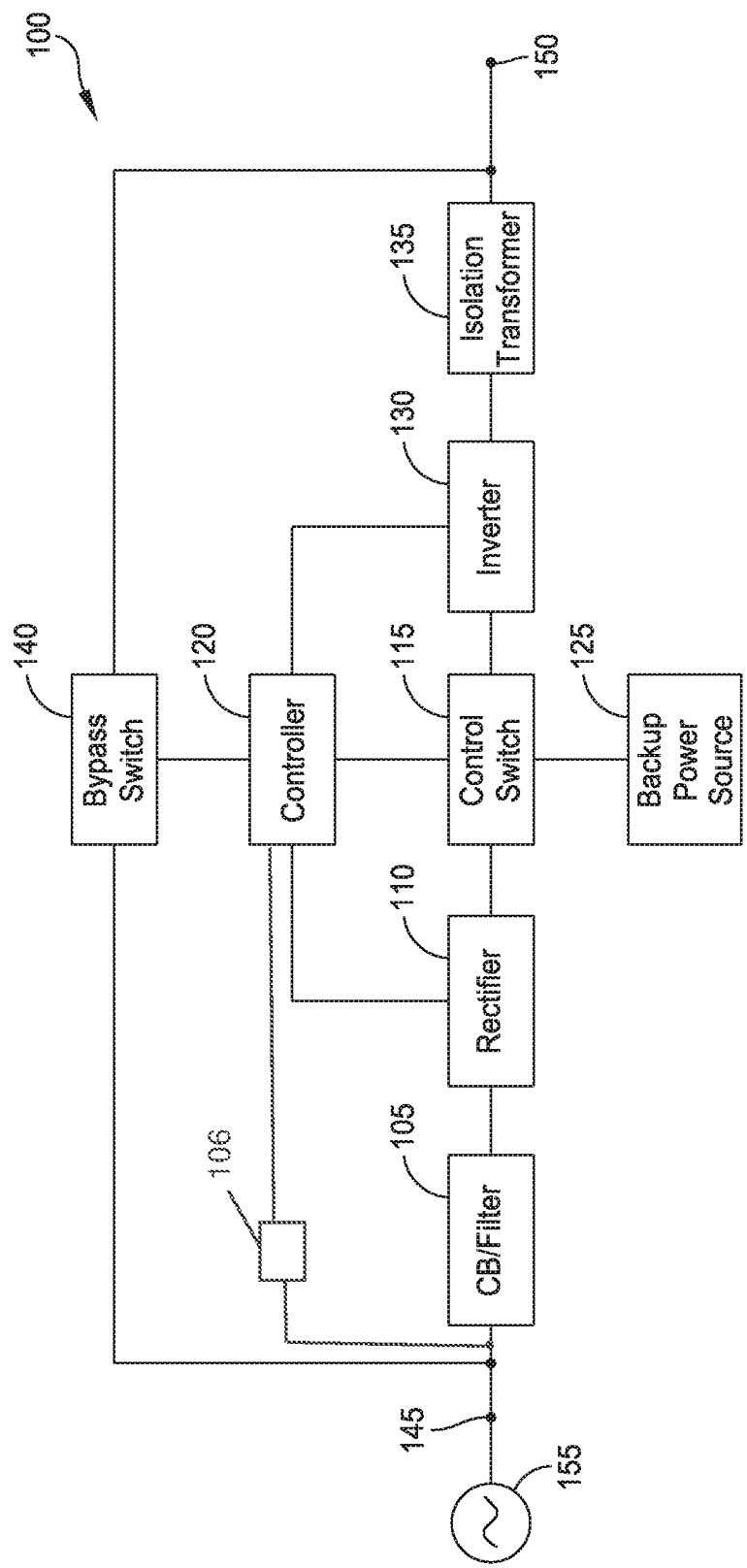
FIG. 1 is a functional block diagram depicting an uninterruptible power supply in accordance with an embodiment.

An uninterruptible power supply (UPS) can operate in different modes depending on the quality of input power to the UPS. For example, for high quality input power, the UPS can run in an economical bypass mode, providing output power substantially directly from the input power. When the input power is of lesser quality, but still available, the UPS can operate in inverter mode, generating high quality output power with greater losses than in bypass mode. When the input power is unavailable, the UPS can operate, usually for a relatively short period of time, in battery mode generating output power from an internal battery.

In at least some embodiments described herein, a UPS can monitor the quality of the input power to detect patterns or changes in the quality of input power that may predict grid failures. By predicting grid failures, the UPS can operate more frequently in bypass mode and appropriately switch to an inverter mode of operation before a degradation in the quality of power. The UPS can also switch to a backup power source to provide more reliable output power to the load prior to actually losing power, ensuring uninterrupted power to the load. The grid failures can be predicted by analyzing data preceding past grid failures. The data analyzed can include various parameters of the input power which can be processed to generate quality metrics, which can provide more useful measures of input power quality.

Examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, components, elements or acts of the systems and methods herein referred to in the singular may also embrace examples including a plurality, and any references in plural to any example, component, element or act herein may also embrace examples including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

FIG. 1 is a functional block diagram 100 depicting an uninterruptible power supply (UPS) 100. The uninterruptible power supply 100 includes power conversion circuitry such as a circuit breaker/filter 105, a rectifier 110, a control switch 115, a controller 120, a backup power source 125, an inverter 130, a transformer such as an isolation transformer 135, and a bypass switch 140. The uninterruptible power supply 100 also includes at least one input 145 and output 150. The input 145 couples an AC power source 155 (e.g., grid power) with the uninterruptible power supply 100, and the output 150 couples the uninterruptable power supply 100 with a load.

In one embodiment, the circuit breaker/filter 105 receives power from the AC power source 155 via the input 145, filters the input power, and provides filtered power to the rectifier 110. The rectifier 110 rectifies the filtered power, and provides rectified power to the control switch 115. The control switch 115 receives the rectified power from the rectifier 110, and receives DC power from the backup power source 125, such as a battery or fuel cell. Under the control of the controller 120, the control switch 115 provides power from the rectifier 110 to the inverter 130. For example, the controller 120 changes the state of the control switch 115 to couple the rectifier 110 with the inverter 130 when the controller 120 determines that the output power of the rectifier 110 is within a tolerance range. In some embodiments, the controller 120 determines that the output power of the rectifier 110 is outside a tolerance range, for example, during a black out or brown out condition. In this example, the controller 120 operates control of the switch 115 to provide DC power from the backup power source 125 to the inverter 130 directly or via intervening components such as the rectifier 110. The uninterruptible power supply 100 also provides power at the output 150 for a load via the backup power source 125 during failure of the AC power source 155.

The inverter 130 receives DC power output from the rectifier 110 or the backup power source 125, converts the DC power to AC power, and regulates the AC power. In some embodiments where the uninterruptible power supply 100 includes the isolation transformer 135, the inverter 130 provides regulated AC power to the isolation transformer 135. The isolation transformer 135 increases or decreases the voltage of the AC power output from the inverter 130, and provides isolation between the uninterruptible power supply 100 and a load.

In some embodiments, the bypass switch 140 couples the AC power source 155 or the input 145 with the output 150, bypassing at least some components of the uninterruptible power supply 100, (e.g., the rectifier 110) to provide power to the output 150 in a bypass mode of operation. For example, the controller 120 controls the bypass switch 140 to operate in the bypass mode when the power quality from the AC power source 155 is within a tolerance range, or when there is a failure of the rectifier 110 or other component of the uninterruptible power supply 100. In some embodiments, the controller 120 receives information from sensors monitoring parameters related to the input power. The parameters are filtered to produce quality metrics, which are used to calculate a quality measure of the input power. The controller 120 operates the UPS 100 in various modes, depending on the quality of the input power. For example, the UPS 100 runs in bypass mode if the quality of the input power is above a first threshold and runs double conversion either through the rectifier or off of the backup power source if the quality of the input power is below a second threshold. It is desirable to operate in bypass mode when possible, as it is the most energy efficient. However, if the quality of the power is too low, the load may be at risk of damage. Further, low quality power or a drop in quality of power may indicate that a grid failure may be more likely to occur, in which case running from the backup power source before the grid fails can prevent damage or power interruption to the load.

In some embodiments, the UPS 100 also includes sensors 106 that monitor the input power. The sensors 106 are coupled to the input 145 and to the controller 120 to measure parameters of the input power and provide the information to the controller 120. The parameters include measureable characteristics of the input power, including electrical characteristics such as voltage, current, power (kilowatts) and energy (kilowatt hours).

In some embodiments, the controller 120 includes at least one processor or other logic device. In some embodiments, the controller 120 includes a digital signal processor (DSP). The controller 120 may also include at least one field programmable gate array (FPGA) and an application specific integrated circuit (ASIC), or other hardware, software, firmware, or combinations thereof. In various embodiments, one or more controllers may be part of the UPS 100, or external to but operatively coupled with the UPS 100. Sensor filters, as further described below, may be part of the controller 120 or a separate device that outputs data responsive, at least in part, to instructions from the controller 120. In some embodiments, the filters can be implemented in software, hardware, firmware, or combinations thereof.

Figure 2:
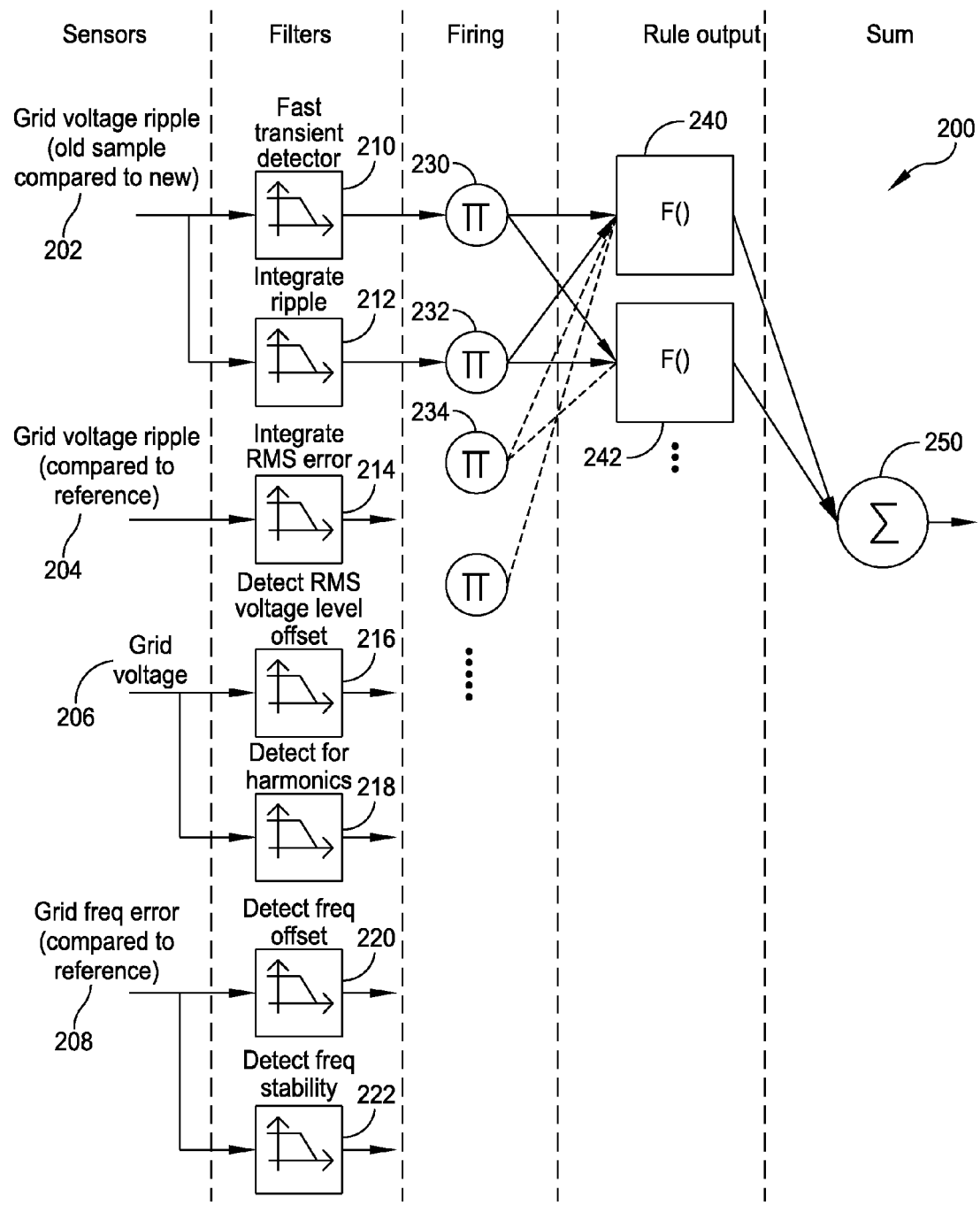
FIG. 2 is a block diagram depicting example sensors and algorithms in accordance with an embodiment.

Referring also to FIG. 2, a functional block diagram 200 is provided. The functional block diagram 200 depicts a grid prediction operation of the UPS 100 in one embodiment. Sensors 202-208 measure parameters of the input power and provide information to sensor filters 210-222. The sensor filters 210-222 extract data from the received information to generate power quality metrics. The power quality metrics are used to calculate a quality measure of the input power. In some embodiments, the power quality metrics are processed through firing rules 230-234 to generate normalized quality ratings that provide comparable metrics for various characteristics of the input power. The quality ratings are combined in rule equations 240-242 to generate rule outputs, which are combined in summation block 250 to generate the quality measure of the input power.

For example, in some embodiments the sensors include a grid frequency error sensor 208. The grid frequency error sensor 208 measures the grid frequency and compares the measured grid frequency with a reference frequency. The grid frequency error sensor 208 outputs the measured grid frequency error to a frequency offset detection filter 220 and a frequency stability detection filter 222. The frequency offset detection filter 220 and the frequency stability detection filter 222 receives a same input from the grid frequency error sensor 208 and applies different filters to generate different power quality metrics. The frequency offset detection filter 220 generates a frequency offset metric that reflects how high or low the grid frequency is. The frequency stability detection filter 222 generates a frequency stability metric that reflects a stability of the grid frequency.

In some embodiments, the frequency offset metric is processed through a firing rule that normalizes the frequency offset metric and generates a frequency offset rating. For example, in some embodiments, the firing rules generate rating values between 0 and 10. A rating of 10 for the frequency offset metric can describe a steady frequency, while a rating of 0 can describe an unstable frequency. For example, if the measured frequency is 67 hertz (Hz), while the reference frequency is 60 Hz, the frequency offset metric firing rule can generate a rating of 5. A firing rule is similarly applied to the frequency stability metric to generate a frequency stability rating between 0 and 10. In this way, various metrics that produce varying values can be more readily compared.

In some embodiments, the firing rules for each metric are specific to each metric. For example, a small change in the frequency stability metric may be more indicative of lower quality grid power than a similarly small change in the frequency offset metric. In such a case, the frequency stability firing rule can be calibrated to reflect the greater deterioration of the power quality with respect to changes in the frequency stability metric. For example, a change of 1% in frequency stability can result in a drop from 10 to 9 of the normalized frequency stability, while a similar drop in normalized frequency offset might result from a 3% change in frequency offset. Other firing rules may be used, including non-linear equations to more accurately reflect the effect of each metric on the quality of power.

In some embodiments, the quality ratings generated by the firing rules are input to rule equations 240, 242. The rule equations 240, 242 receive one or more of the quality ratings to generate a rule output. The one or more quality ratings can be combined in a linear or non-linear equation. For example, the frequency offset rating and the frequency stability rating can be input into a rule equation. The rule equation can determine, for example, that a lower frequency offset rating (e.g., 5) with a higher frequency stability rating (e.g., 9) can indicate a higher quality of grid power than a higher frequency offset rating (e.g., 8) with a lower frequency stability rating (e.g., 5). For example, the rule equation can be $$k_1 \times [\text{frequency offset rating}] + k_2 \times [\text{frequency stability rating}]$$

where $k_1=1$ and $k_2=10$.

Using this example rule equation, the lower frequency offset and higher frequency stability would result in a rule output of 95, while the higher frequency offset and lower frequency stability would result in a rule output of 58, indicating lower quality power and possibly a less stable grid. The values for $k_1$ and $k_2$ can also be adjusted based on observations and data mining, as will be described further below.

In another example, a rule equation can receive the frequency offset rating and a voltage offset rating. A combined decrease in both frequency offset and voltage offset can represent an overload situation, where more energy is demanded from loads on the grid than what is being generated by, for example, a supplying turbine. For example, the increase in demand can result in a drop in voltage offset and frequency offset, which can lead to active loads on the grid increasing current drawn to sustain an energy level to the loads. If a sufficient number of active loads increase current demand, the grid can collapse if more energy is not made available to the grid. Thus, the combined drop in frequency offset and voltage offset can be configured to indicate a lower quality of grid power.

The rule equations can output a confidence value, such as a percentage between 0 and 100, of the quality of the power based on the received quality ratings. In some embodiments, the confidence values from each of the rule equations are combined to generate a final quality measure of the input power. The confidence values can be combined as an average, weighted average, or some other equation. The quality measure can also be a percentage between 0 and 100 reflecting a confidence in the grid power. The quality measure can reflect both a quality and a reliability of the input power. For example, low quality power or a drop in quality of power may be predictive of a possible grid failure.

In some embodiments, the sensors include a grid voltage ripple sensor 202, a grid voltage error sensor 204, a grid voltage sensor 206, and a grid frequency error sensor 208, among other sensors that can measure parameters related to the input power. The grid voltage ripple sensor 202 provides information about ripples in the input power voltage. The grid voltage ripple sensor 202 measures the grid voltage and compare the grid voltage to a time delayed signal of the grid voltage. The grid voltage ripple sensor 202 outputs the measured grid voltage ripple to a fast transient detection filter 210 and a ripple integration filter 212. The fast transient detection filter 210 is used to detect fast transients, for example, caused by a thunderstorm. The ripple integration filter 210 provides information regarding general conditions on a grid. For example, a grid installation placed next to a six pulse rectifier that draws current in pulses can generate a ripple, which may affect grid power quality. Firing rules 230, 232 for each of the filters 210, 212 generate normalized quality ratings for each of the quality metrics generated by the filters 210, 212. The quality ratings are then used by various rule equations 240, 242 to generate confidence values to be included in the quality measure.

In some embodiments, the sensors also include a grid voltage error sensor 204. The grid voltage error sensor 204 measures the grid voltage and compare the measured grid voltage to a reference voltage to measure a grid voltage error. The grid voltage error is input to a root mean square (RMS) error integration filter 214. The sensors also include a grid voltage sensor 206 that measures the grid voltage. The grid voltage is input to an RMS voltage level offset detection filter 216 and a harmonics detection filter 218. The RMS voltage level offset detection filter 216 determines an offset of the RMS voltage level, which can indicate that an energy generating unit of the grid is faulty or not powerful enough. At some sites, a decrease in RMS voltage level may be a normal situation caused by a voltage drop in long supply lines. The harmonics detection filter 218 detects the presence of harmonics, which can be caused by other nearby electrical systems causing a skew in drawn current. Harmonics can also indicate a specific change in the power source, for example, from grid power to generator power. The sensors and firing rules can also include an indication of the power source to the loads to account for such a change. Each of the filters generate metrics that are input to firing rules that generate quality ratings. The quality ratings are used in rule equations to generate confidence measures.

In some embodiments, the firing rules and the rule equations are based on pre-programmed patterns that are typically indicative of lower power quality and/or likely grid failures. For example, a sudden change in the frequency stability of the input power may be typically followed by grid failure. In such a case, the firing rules and or rule equations can be such that the sudden change in frequency stability generates a low quality measure. The controller can be configured to switch to the backup power source in anticipation of the grid failure, or switch from bypass to inverter mode of operation, providing uninterrupted power to the load and protecting the load from the effects of the grid failure. In some embodiments, the controller is configured to run in various modes depending on the quality measure. For example, if the quality measure is high, indicating a high confidence in the quality of the input power, the controller can run the UPS in bypass mode, providing the input power directly to the load. If the quality measure is below a certain threshold, the UPS can be run in inverter operation, routing the input power through various components of the UPS to provide a more reliable quality of power to the load. If the quality measure is below a second threshold, the UPS can run from the backup power source, as the low quality measure can indicate a possible grid failure. The threshold levels used to switch operation modes of the UPS can be pre-programmed. Alternatively or additionally, the threshold levels can be provided or changed by a user. The threshold level can be set based on a preference indicated by the user of saving energy versus a risk tolerance level.

Figure 3:
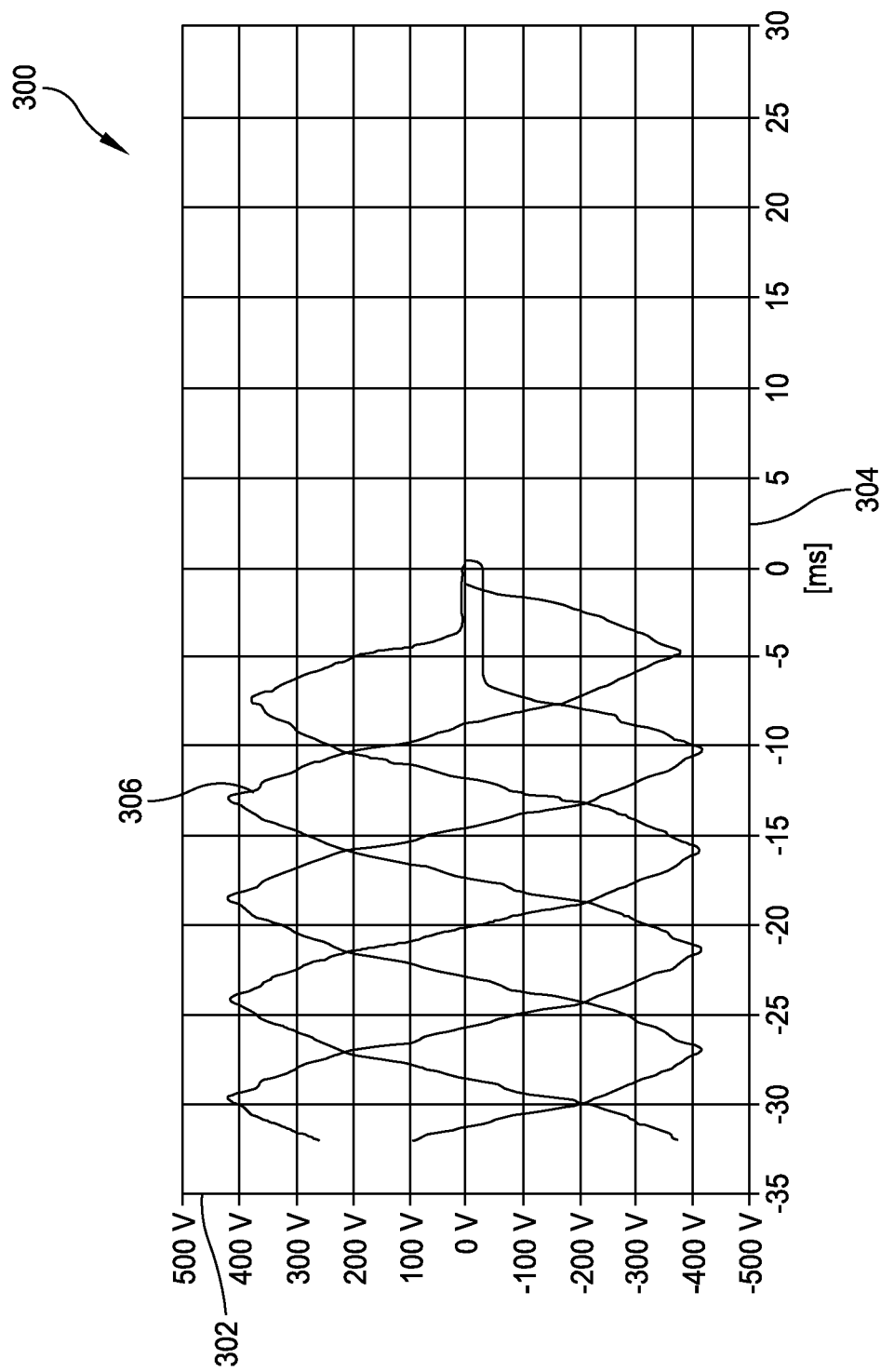
FIG. 3 is a graph showing an example data output in accordance with an embodiment.

In some embodiments, the firing rules and the rule equations are adjusted based on past observation. For example, data can be stored for some or all of the parameters, quality metrics, quality factors, and the confidence values generated based on the input power as the UPS is operational. The data can be analyzed, for example, for patterns preceding a grid failure. For example, FIG. 3 shows an example graph 300 of a parameter of input power preceding a grid failure. The parameter measured in the graph 300 is a voltage level 306, shown on the y-axis 302 with respect to time, shown on the x-axis 304. The peaks of the voltage level 306 can be seen decreasing slightly before the grid failure. Further, the voltage level 306 can also be seen changing levels too quickly at the peaks, where the voltage level 306 is not sinusoidal. Different filters can be used to detect these kinds of changes which may be indicative of a possible grid failure.

In some embodiments, analyzing the data for grid failures and adjusting the firing rules and rule equations can result in more accurate predictions for future grid failures, as the parameters and quality metrics of the input power can vary depending on factors that can be different for each site at which the UPS is being used. The factors can include, for example, elements connected to the grid and operating procedures.

In some embodiments, patterns that are detected through analyzing the data are used to adjust the firing rules and rule operations proportional to a confidence of a correlation between the pattern and a grid failure. For example, if a pattern of metrics is detected in half of the grid failures, the firing rules and rule operations related to the metrics can be adjusted to reflect a 50% confidence. The confidence correlation can also depend on detecting the pattern in absence of a grid failure. For example, if the pattern of metrics is detected in half of the grid failures, but the pattern is not detected with any absence of failures (i.e., the pattern does not precede every grid failure, but the pattern always results in a grid failure), the firing rules and rule equations can reflect the high probability of grid failure upon detecting the pattern.

The firing rules and rule equations can be continually adjusted as more data is collected. For example, grid failures experienced while a high quality measure was being output can be analyzed more closely to determine new patterns that may indicate probable grid faults. Additionally, instances of patterns that are designated as low quality power indicators that do not result in grid faults can be used to adjust the firing rules and rule equations to lessen false positives.

In some embodiments, the patterns can also vary in time frames. For example, the data can be analyzed to find patterns in a very short time before the grid failure, such as 10 to 15 milliseconds. Additional data analysis can be conducted on longer time frames, such as the 1 second leading up to the grid failure. Various different time frames can be used which can provide different types of patterns and indicators of possible grid failures.

Figure 4:
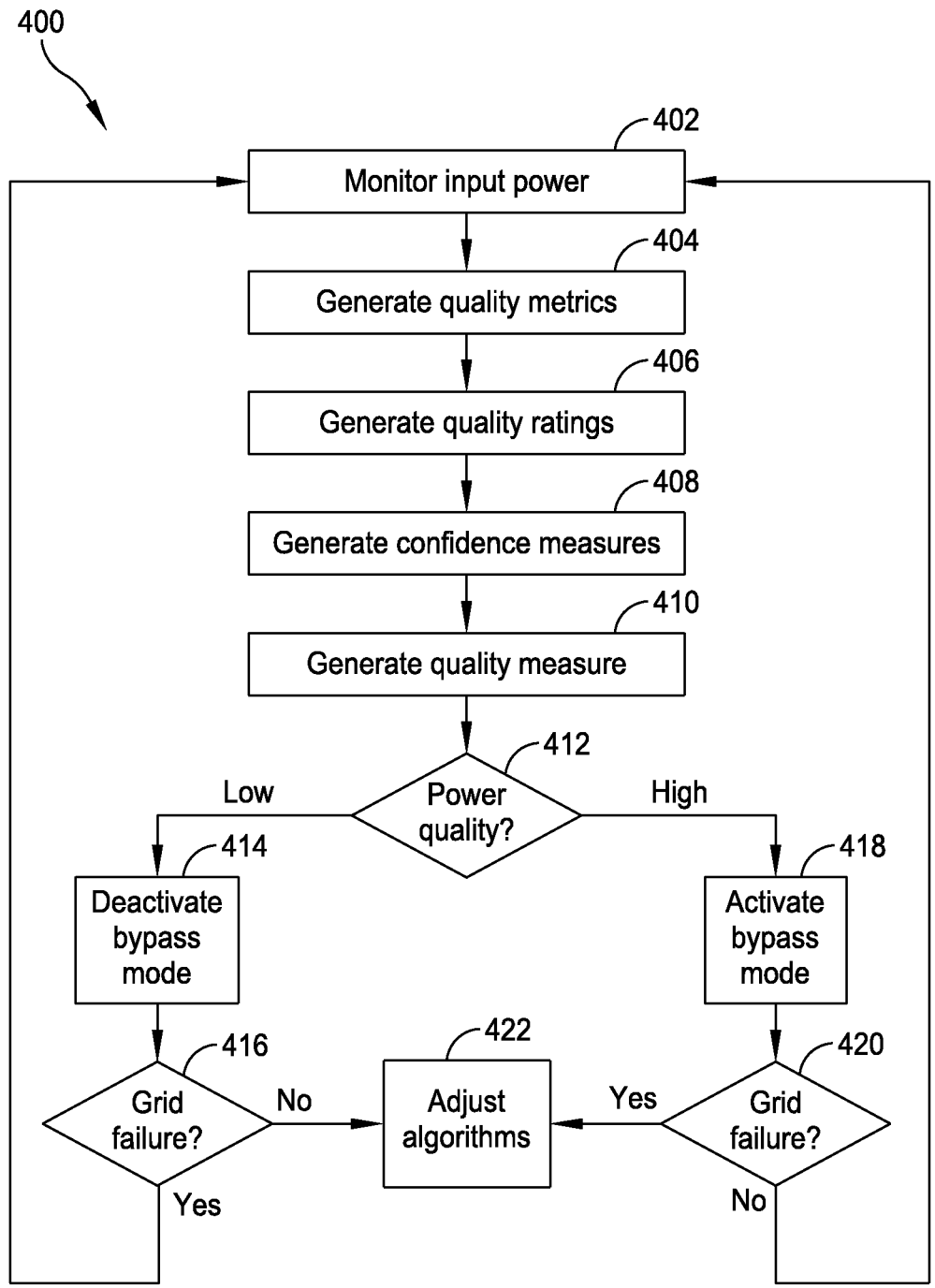
FIG. 4 is a flow chart showing an example process in accordance with an embodiment.

FIG. 4 shows an example process 400 according to some embodiments. At stage 402, input power is monitored. The input power can be monitored as described above, using sensors to measure parameters of the input power. At stage 404, quality metrics are generated. The quality metrics can be generated by filtering the measured parameters using filters as described above. At stage 406, quality ratings are generated. The quality ratings can be generated using firing rules that normalize the quality metrics as described above. At stage 408, confidence measures are generated. The confidence measures can be generated by processing the quality ratings with rule equations, as described above. At stage 410, a quality measure is generated. The quality measure can be generated by combining the confidence measures as described above. The quality measure can provide an overall confidence of the quality of the input power and a likelihood of a grid failure. For example, a high quality measure can indicate high quality input power and that a grid failure is unlikely.

At stage 412, the quality measure is checked. For example, if the quality measure is low, or if the quality measure drops suddenly or gradually, the low quality measure can indicate a deterioration in the input power quality. If a deterioration in the input power quality is detected, or if the input power quality is sufficiently low, the UPS can change a mode of operation. For example, at stage 414, a bypass mode of operation can be deactivated. The bypass mode of operation can couple the input of the UPS to the output of the UPS to provide output power substantially directly from the input power. If the power quality deteriorates below a threshold, the load may be more reliably powered by deactivating the bypass mode of operation and/or supplying the load via a backup power source or through the inverter. At stage 416, the grid can be checked for failure. If the power quality measure drops below a threshold, the change in quality measure may be predicting a grid failure. If the grid failure does not occur, then at stage 422, algorithms can be adjusted. The algorithms include the firing rules that generate the quality ratings and the rule equations that generate the confidence measures. The algorithm can also include how the confidence measures are combined to generate the quality measure, as well as what filters are used to generate quality metrics, and what sensors are used to measure parameters of the input power. If a grid fault does occur, the process 400 can continue monitoring input power, for example, to determine when the bypass mode of operation can be safely resumed.

If power quality is high, at stage 418, the bypass mode of operation can be activated. The UPS may already be running in a bypass mode, in which case the bypass mode can be continued, as little or no deterioration in power quality is detected. At stage 420, the grid can be checked for failure. If a grid failure is detected while the system outputs a high power quality, at stage 422, the algorithms can be adjusted to more accurately predict grid failures. If a grid failure is not detected, the process 400 can continue monitoring input power, for example, to ensure bypass mode can safely be continued.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An uninterruptible power supply, comprising:
   an input configured to receive input power;
   one or more sensors configured to monitor one or more parameters related to the input power;
   an output;
   a power conversion circuit coupled with the input and the output;
   a bypass switch configured to couple the input to the output in a bypass mode of operation, and to decouple the input from the output in a double conversion mode of operation and in a backup mode of operation; and
   a controller coupled with the power conversion circuit and the bypass switch, the controller configured to:
      receive, from the one or more sensors, values for a plurality of parameters;
      filter the values to determine a plurality of quality metrics;
      calculate, based on the quality metrics, a quality measure of the input power and compare the quality measure with a first threshold; and
      control the bypass switch to switch from bypass mode of operation decoupling the input from the output, and control the power conversion circuit to operate in double conversion mode of operation based on the comparison of the quality measure with the first threshold.

2. The uninterruptible power supply of claim 1, wherein the quality measure comprises a likelihood of a grid failure.

3. The uninterruptible power supply of claim 1, further comprising a backup power source coupled to the power conversion circuit, and wherein the controller is configured to couple the output to the backup power source based on comparison of the quality measure with a second threshold.

4. The uninterruptible power supply of claim 1, wherein the controller is further configured to:
   normalize the quality metrics to generate quality ratings;
   generate, based on the quality ratings, confidence measures; and
   wherein calculating the quality measure comprises combining the confidence measures to generate the quality measure.

5. The uninterruptible power supply of claim 4, wherein the generating the confidence measures comprises comparing the quality metrics to one or more threshold measures.

6. The uninterruptible power supply of claim 5, wherein the one or more threshold measures are determined based on one or more quality metrics measured preceding one or more past grid failures.

7. The uninterruptible power supply of claim 6, wherein the quality metrics are normalized and the confidence measures are generated based on a set of algorithms, the set of algorithms adjusted based on the quality metrics measured preceding the one or more past grid failures.

8. The uninterruptible power supply of claim 1, wherein the one or more sensors comprise at least one of a grid voltage ripple sensor, a grid voltage error sensor, and a grid frequency error sensor.

9. The uninterruptible power supply of claim 1, wherein the controller is configured to filter the plurality of parameters using at least one of a fast transient detection filter, a ripple integration filter, a root mean square error integration filter, a root mean square voltage level offset detection filter, a harmonics detection filter, a frequency offset detection filter, and a frequency stability detection filter.

10. A method of distributing power using an uninterruptible power supply, the method comprising:
    receiving, at an input, an input power;
    controlling a bypass switch to a closed position to provide the input power to an output through the bypass switch to operate the uninterruptible power supply in a bypass mode of operation;
    monitoring a plurality of parameters related to the input power;
    filtering values for the plurality of parameters to determine a plurality of quality metrics;
    calculating, based on the quality metrics, a quality measure of the input power;
    comparing the quality measure with a first threshold; and
    based on the comparison of the quality measure with the first threshold switching the bypass switch to an open position to operate the uninterruptible power supply in a double conversion mode of operation.

11. The method of claim 10, wherein the quality measure comprises a likelihood of a grid failure.

12. The method of claim 10, wherein providing the output power comprises coupling the output to a backup power source based on a comparison of the quality measure with a second threshold.

13. The method of claim 10, further comprising:
    normalizing the quality metrics to generate quality ratings;
    generating, based on the quality ratings, confidence measures; and
    wherein calculating the quality measure comprises combining the confidence measures to generate the quality measure.

14. The method of claim 13, wherein generating the confidence measures comprises comparing one or more quality metrics to one or more threshold measures.

15. The method of claim 14, wherein the one or more threshold measures are determined based on one or more quality metrics measured preceding one or more past grid failures.

16. The method of claim 15, wherein the quality metrics are normalized and the confidence measures are generated based on a set of algorithms, the set of algorithms adjusted based on the one or more quality metrics measured preceding the one or more past grid failures.

17. The method of claim 10, wherein the plurality of parameters is monitored by sensors comprising at least one of a grid voltage ripple sensor, a grid voltage error sensor, and a grid frequency error sensor.

18. The method of claim 10, wherein filtering the values comprises using at least one of a fast transient detection filter, a ripple integration filter, a root mean square error integration filter, a root mean square voltage level offset detection filter, a harmonics detection filter, a frequency offset detection filter, and a frequency stability detection filter.

\* \* \* \* \*